United States Patent
Katoh

(10) Patent No.: US 7,829,381 B2
(45) Date of Patent: Nov. 9, 2010

(54) METHOD OF MANUFACTURING A SEMICONDUCTOR DEVICE

(75) Inventor: Kaoru Katoh, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 193 days.

(21) Appl. No.: 12/323,056

(22) Filed: Nov. 25, 2008

(65) Prior Publication Data

US 2009/0142884 A1 Jun. 4, 2009

(30) Foreign Application Priority Data

Nov. 30, 2007 (JP) .............................. 2007-310970

(51) Int. Cl.
*H01L 21/00* (2006.01)

(52) U.S. Cl. ....................... 438/108; 438/107; 438/113; 257/E21.511

(58) Field of Classification Search ................. 438/107, 438/108, 113; 257/E21.511
See application file for complete search history.

(56) References Cited

U.S. PATENT DOCUMENTS

| 5,128,746 A | 7/1992 | Pennisi et al. |
| 2002/0109228 A1 * | 8/2002 | Buchwalter et al. ......... 257/738 |
| 2006/0134901 A1 | 6/2006 | Chaware et al. |

FOREIGN PATENT DOCUMENTS

| JP | 4-280443 A | 10/1992 |
| JP | 2000-174044 A | 6/2000 |
| JP | 2003-243449 A | 8/2003 |
| JP | 2005-268704 A | 9/2005 |
| JP | 2006-229199 A | 8/2006 |

\* cited by examiner

*Primary Examiner*—Alexander G Ghyka
*Assistant Examiner*—Seahvosh J Nikmanesh
(74) *Attorney, Agent, or Firm*—Birch, Stewart, Kolasch & Birch, LLP

(57) ABSTRACT

A method of manufacturing a semiconductor device comprising the steps of (1) applying an underfill composition to a surface of a silicon wafer, (2) dicing the silicon wafer into chips, (3) positioning the chip, and (4) bonding the chip to the substrate, characterized in that
the underfill composition consists of a first underfill composition and a second underfill composition,
the step (1) comprises the steps of
(i) applying the first underfill composition on the surface of the silicon wafer and then bringing the applied first underfill composition into a B-stage to form a layer of the first underfill composition having a thickness ranging from 0.5 to 1.0 time the height of the solder bump, and
(ii) applying the second underfill composition on the B-stage first underfill composition layer and bringing the applied second underfill composition into a B-stage to form a layer wherein a total thickness of the B-stage first underfill composition and the B-stage second underfill composition ranges from 1.0 to 1.3 times the height of the solder bump, and that
the first underfill composition comprises an epoxy resin and a filler, the filler being in an amount of from 30 to 85 wt % of a solid content of the first underfill composition, and
the second underfill composition comprises an epoxy resin, a flux and/or a curing agent functioning also as a flux.

6 Claims, 1 Drawing Sheet

METHOD OF MANUFACTURING A SEMICONDUCTOR DEVICE

CROSS REFERENCE

This application claims benefit of Japanese Patent application No. 2007-310970 filed on Nov. 30, 2007, the contents of which are hereby incorporated by reference.

FIELD OF THE INVENTION

The present invention relates to a method of under-filling a flip-chip bonded semiconductor chip and a semiconductor device prepared by using the method.

BACKGROUND OF THE INVENTION

Frip-chip bonding is a method of connecting a silicon chip to a substrate by flipping over the chip so that its top side faces down and connecting the chip via solder bumps provided on the top side of the chip where integrated circuits are created, hereinafter referred to as "circuit side." An underfill composition fills a space between the silicon chip and the substrate to secure reliability of the connection by preventing cracks in the solder connection. Conventionally, an underfill composition fills the space between the silicon chip and the substrate by capillary action. However, in a large scale semiconductor device where a side length of a silicon die exceeds 10 mm or even 20 mm, a part of the space between the silicon chip and a substrate tends to remain unfilled with an underfill composition. An underfill composition containing lower amount of filler can fill the space more easily, but a cured product of such agent has larger thermal expansion coefficient, causing problems such as peeling at an interface between the cured product of the underfill composition and the chip or the substrate.

In addition, a process of soaking an underfill composition by capillary action requires many steps, increasing manufacturing costs. To solve this problem, Japanese Patent Application Laid-Open No. 04-280443 discloses a so-called non flow underfill method. In this method, an underfill material comprising a flux agent is applied on a surface of the substrate before bonding a chip, and the applied underfill composition is cured simultaneously with soldering a chip to the substrate. By using this method, manufacturing costs can be reduced.

The aforesaid flux agent is a proton donor such as abietic acid which reduces oxidized surface of solder bumps. In the reduction reaction, water is generated which vaporizes during a reflow process and tends to cause voids in the solder connection.

Japanese Patent Application Laid-Open No. 2000-174044 discloses so-called B-stage underfill or wafer-level underfill method in which an underfill composition applied on a silicon wafer is brought into a B-stage and then diced together with the wafer. Japanese Patent Application Laid-Open No. 2003-243449 discloses an improvement of the method in which an underfill layer consists of two layers: one layer comprising a flux used to surround solder bumps and the other layer which comprises filler and is placed on solder joint pads provided on a substrate. A drawback of the method is laborious steps of applying an underfill composition to a wafer and to a substrate, respectively. In addition, solder contact failure may occur due to lack of flux on the pads. Further, the layer comprising the filler has poor transparency, so that the layer degrades visibility of solder bumps when it covers the solder bumps, causing difficulty in positioning of the wafer in dicing and soldering processes. Moreover, the underfill composition comprising flux surrounds the solder bumps, so that voids tend to occur by water vapor as described above.

Japanese Patent Application Laid-Open No. 2005-268704 discloses a method in which an underfill composition is applied in such a thickness that a top of a solder ball protrudes from the applied underfill composition and then is put into a B-stage followed by applying a flux on the top of the solder ball. The method, however, is laborious in that the underfill composition had to be applied to each device package and the flux had to be applied to each device package after the underfill composition is brought into a B-stage. Further, a cured product of the underfill composition may be adversely affected due to a compositional change caused by a possible reaction between the flux and the underfill composition.

Japanese Patent Application Laid-Open No. 2006-229199 discloses a wafer-level underfill method in which a hot-melt type of underfill composition is polished till a top of a solder bump appears and then diced. In the method, however, voids tend to be formed due to curing shrinkage, and fillets surrounding a chip tend to be formed. Moreover, exposed solder tends to be oxidized. This necessitates application of larger amount of commercially available flux which tends to form voids due to a large amount of diluent contained in the flux.

SUMMARY OF THE INVENTION

An object of the present invention is to solve the aforesaid problems. After extensive studies, the inventor has found that the use of a two-component underfill composition can solve the problems. The underfill composition consists of a first underfill composition to be applied to solder bumps comprising relatively large amount of filler and a second underfill composition to be applied on the first underfill composition, facing a substrate, comprising a thermosetting resin and a flux.

The present invention is a method of manufacturing a semiconductor device comprising the steps of (1) applying an underfill composition to a surface of a silicon wafer on which surface solder bumps for flip chip bonding are provided and, then, bringing the underfill composition into a B-stage, (2) dicing the silicon wafer into chips, (3) positioning the chip with a site on a substrate where the chip is to be bonded, and (4) bonding the chip to the substrate by melting the solder bumps, characterized in that the underfill composition consists of a first underfill composition and a second underfill composition, the step (1) comprises the steps of (i) applying the first underfill composition on the surface of the silicon wafer and then bringing the applied first underfill composition into a B-stage to form a layer of the first underfill composition having a thickness ranging from 0.5 to 1.0 time the height of the solder bump, and (ii) applying the second underfill composition on the B-stage first underfill composition layer and bringing the applied second underfill composition into a B-stage to form a layer wherein a total thickness of the B-stage first underfill composition and the B-stage second underfill composition ranges from 1.0 to 1.3 times the height of the solder bump, and that the first underfill composition comprises an epoxy resin and a filler, the filler being in an amount of from 30 to 85 wt % of a solid content of the first underfill composition, and the second underfill composition comprises an epoxy resin, a flux and/or a curing agent functioning also as a flux.

By using the aforesaid method of the present invention, the underfill compositions can be applied on a wafer sequentially, and visibility of solder bumps are not impaired. Solder connectivity between solder bumps and pads is further improved with a second underfill composition comprising a highly effective flux.

DESCRIPTION OF THE PREFERRED EMBODIMENTS

Figure 1:
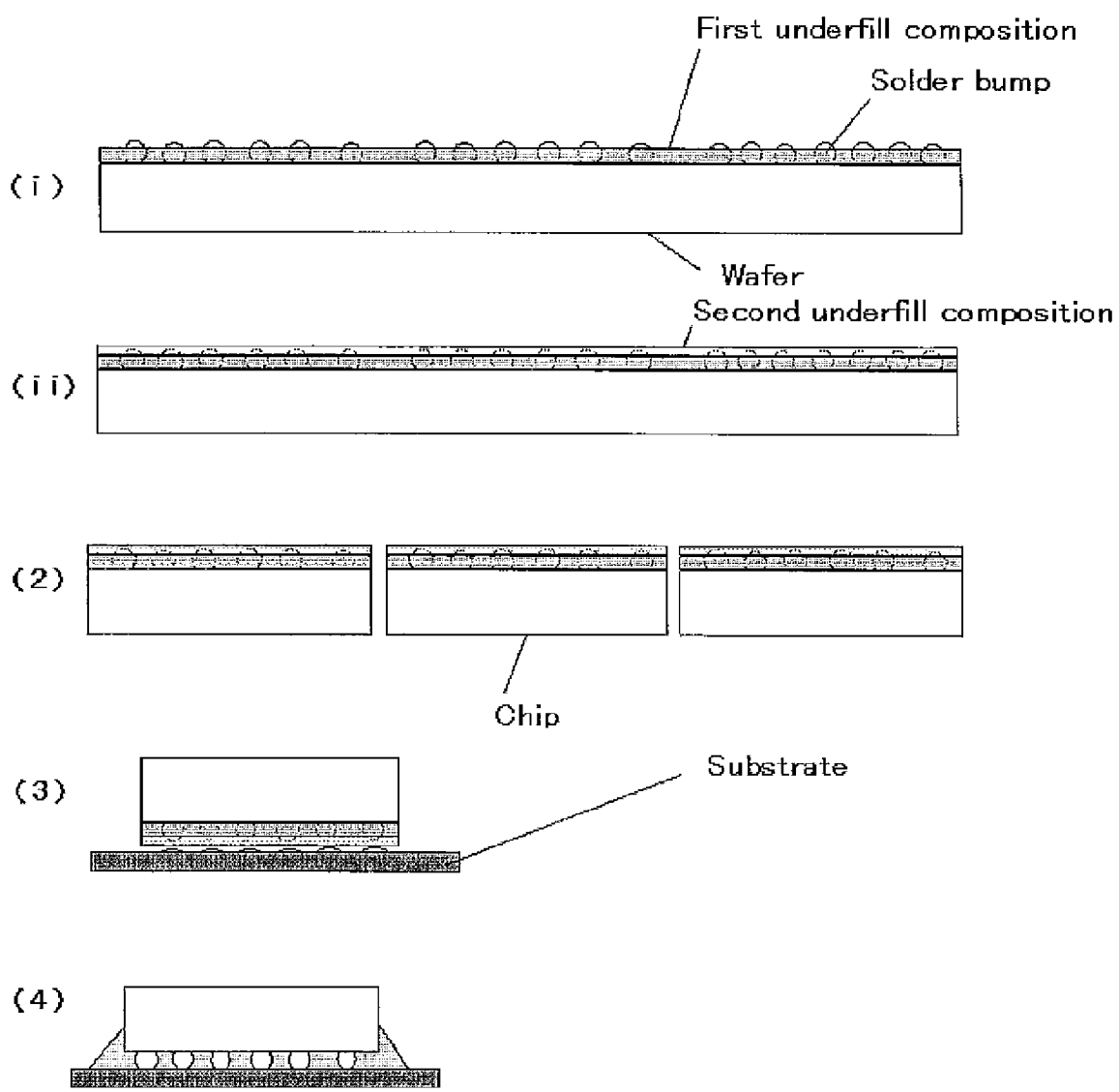
FIG. 1 is a schematic illustration of the present method.

The present invention will be explained with reference to FIG. 1. In the step (i), a first underfill composition is applied on a circuit side of a wafer. The wafer is provided with scribe lines for dicing the wafer into plurality of chips. Each chip is provided with plurality of solder bumps for flip-chip bonding. The application of the first underfill composition can be performed in any known method among which stencil printing and spin coating are preferred. Screen printing is not preferred for the reason that solder bumps may be damaged by reticules of a screen mask. A first underfill composition which is solid at room temperature may be applied while heating the underfill composition and a wafer at a temperature where the underfill composition is fluid.

In the next step, the applied first underfill composition is brought into B-stage where the underfill composition is halfway cured to lose fluidity. A first underfill composition comprising a solvent is brought into a B-stage by evaporating the solvent by heating. A first underfill composition which is solid at a room temperature is put into B-stage by applying the agent to a wafer at an elevated temperature followed by cooling the applied agent to room temperature. In both cases, temperature should be low enough not to promote curing of the underfill composition, that is, a temperature sufficiently lower, preferably lower by 40° C., than onset temperature of curing.

Preferably, the B-stage first underfill composition is etched by polishing or ashing till top surface of solder bumps appears. By the etching, bonding strength and visibility of solder bumps are improved.

Thickness of the layer of B-stage first underfill composition is in the range of from 0.5 to 1.0 time the height of a solder bump. If the layer is thinner than aforesaid lower limit, such layer cannot sufficiently protect soldered portion. An underfill composition layer thicker than the aforesaid upper limit may inhibit forming a good solder joint and impair visibility of solder bumps in the after mentioned step (3).

In the step (ii), a second underfill composition is applied on the B-stage first underfill composition layer in the same manner as mentioned above for the first underfill composition. Then, the applied second underfill composition is brought into B-stage to obtain a double-layered underfill composition layer having a total thickness of the B-stage first underfill composition and the B-stage second underfill composition ranging from 1.0 to 1.3 times, preferably 1.1 to 1.2 times the height of a solder bump. If the total thickness is below the aforesaid lower limit, a void may be formed between a silicon chip and a substrate for the reason that the underfill compositions spread in the soldering step (4), failing to fill the space between a chip and a substrate. An underfill composition layer having a thickness larger than the aforesaid upper limit may go beyond a chip surface to contaminate the chip or makes large fillets to prevent integrity of the chip.

In the step (2), the silicon wafer together with the underfill compositions is diced or cut into segments. Dicing can be performed by any known dicer. The B-stage first underfill and second underfill compositions are also diced. Subsequently, a segment of the wafer, hereinafter referred to as "chip", is picked up and positioned on pads to be bonded to the chip. The positioning can be performed with any known flip-chip bonder and the following process (4) can be carried out sequentially.

In the step (4), solder bumps are molten and a chip is soldered to a substrate. The soldering can be performed by rapidly heating to 200° C. or higher with a pulse-heating type flip-chip bonder that can be used also for the aforesaid positioning, or by reflow soldering with an IR reflow furnace after pressure bonding a chip to a substrate while heating the substrate and/or the chip so as to melt a surface of the second underfill composition. By heating, the first underfill and the second underfill compositions are softened, allowing solder bumps to come into contact with pads, and curing reaction starts at the same time. By selecting an appropriate curing catalyst to promote curing, curing can be completed upon completion of soldering. An underfill composition with low reactivity may be heated in an oven after the soldering process.

An epoxy resin used in the first underfill composition can be any epoxy resin having a functionality of at least two. Example of the epoxy resin include bisphenol type epoxy reins; novolac type epoxy resin such as phenol novolac type epoxy resins and cresol novolac type epoxy resin; naphthalene type epoxy resins, biphenyl type epoxy resins, cyclopentadiene type epoxy resins, and a mixture of two or more of these resins. The epoxy resins which are solid at room temperature are preferred to form a B-stage layer having a tack free surface, which is desirable in post processes. An epoxy resin which is liquid at room temperature tends to form a B-stage layer with a tacky surface. Such tackiness can be avoided by heating the resin to halfway cure the resin. However, such halfway cured resin may not become soft enough in a soldering process, causing connection failure. More preferably, an epoxy resin free from impurities, particularly ionic impurities, is used. For the second underfill composition, any one of the aforesaid epoxy resins selected independently from the first underfill composition can be used.

A filler is incorporated in the first underfill composition to improve mechanical strength of the underfill composition and to decrease thermal expansion coefficient of a cured product. Examples of the inorganic filler include fused silica, crystalline silica, alumina, titaniumdioxide, silica-titania, boron nitride, aluminum nitride, silicon nitride, magnesia, magnesium silicate, aluminum and a mixture thereof. Particularly preferred is spherical silica to make viscosity of the first underfill composition low in the step (4). The filler preferably has an average particle size ($D_{50}$) of from 0.5 to 10 μm. Preferably, the filler has a maximum particle size ($D_{90}$) of at most a half the height of a solder bump. Further, the underfill compositions are preferably highly thixotropic to form a layer of uniform thickness. For that purpose, the underfill composition preferably comprises pulverized filler, particularly finely pulverized silica having an average particle size of at most 0.2 μm. Examples of the finely pulverized silica include various kinds of fumed silica such as Aerosil 130, Aerosil 200, Aerosil 300, and Aerosil 380, all available from Nippon Aerosil Co., Ltd, having a specific surface are of 130 m$^2$/g, 200 m$^2$/g, 300 m$^2$/g, and 380 m$^2$/g, respectively. The aforesaid average particle size can be measured by centrifugal sedimentation method or laser diffraction method, and the maximum particle size can be measured by screening method.

An amount of the filler in the first underfill composition ranges from 30 to 85 wt %, preferably from 50 to 85 wt % of a solid content, that is, total weight of components except volatile component, of the first underfill composition. The filler in an amount less than the aforesaid lower limit may not improve mechanical strength or reduce thermal expansion coefficient of a cured product sufficiently. The second underfill composition does not necessarily contain a filler. When it is contained, the content thereof is less than 30 wt %, preferably less than 20 wt %, of a solid content of the second underfill composition, that is, total weight of components except volatile component, of the second underfill composition. More than 30 wt % of the filler would decrease transparency of the second underfill composition to make positioning of a semiconductor chip with a substrate difficult, and may hinder soldering by intruding in molten solder.

The second underfill composition contains a flux and/or a curing agent functioning also as a flux, hereinafter simply referred to as "flux component." The flux component reduces oxidized layer of solder surface as described above. A typical flux component is a proton donor substance.

Examples of the proton donor flux include abietic acid, dehydroabietic acid, dihydroabietic acid, tetrahydroabietic acid, neoabietic acid, isopimaric acid, pimaric acid, levopimaric acid, parastrinic acid, benzoic acid, stearic acid, lactic acid, citric acid, oxalic acid, succinic acid, adipic acid, and sebacic acid.

Examples of the curing agent functioning also as a flux include phenolic resin, acid anhydrides, and amine curing agents. Mixtures of these curing agents with the aforesaid acid such as abietic acid can be used.

The flux component is contained preferably in an amount of from 0.5 to 3 parts by weight per 100 parts by weight of the resin components or solid components other than filler. If it is contained less than the aforesaid lower limit, flux capability may not be sufficient. If it is contained more than the aforesaid upper limit, physical properties of a cured product of the underfill composition may be worse.

When the flux component which function also as a curing agent, for example, phenolic resin or acid anhydride, is used, it is contained preferably in such an amount that a molar ratio of its epoxy-reactive groups/the epoxy groups of the epoxy resin ranges from 0.95 to 1.25 as described above. If it is contained in an amount less than the aforesaid lower limit, good solder joint may not be made. When it is contained in such an amount that the aforesaid ratio is 1.0 or smaller, concomitant use of abietic acid is preferred.

The first underfill composition does not necessarily contain a curing agent, but can contain in such an amount that the curing agent does not adversely affect the present invention. Any of the curing agents described above for the second underfill composition can be used, among which the phenolic resin and acid anhydride curing agents, particularly those with little impurities and those which are solid at room temperature are preferred for the reasons as described above. The curing agent is contained in such an amount that a molar ratio of an epoxy-reactive group in the curing agent/epoxy group in the epoxy resin preferably ranges from 0.9 to 1.05, particularly from 0.95 to 1.0. If it is contained in an amount outside the aforesaid range, a curing product with desired properties may not be obtained. Further, a curing agent in an amount above the aforesaid upper limit may increase amounts of volatiles or water vapor formed by the reduction reaction, causing formation of voids in the curing product. The first underfill composition may contain the flux component in an amount less than 0.5 part by weight per 100 parts by weight of the resinous components. Preferably, the first underfill composition does not contain the flux component.

In addition to the aforesaid components, the first underfill composition and the second underfill composition may contain a volatile solvent to improve handling property in the application process. Examples of the solvent include carbitol solvents, cellosolve solvents and propylene glycol monomethyl ether acetate (PGMEA).

A thermoplastic polymer can be added to the compositions to improve mechanical strength tolerant of force applied in the dicing process. Other additive such as a polymerization catalyst, a silane coupling agent or an ion trap agent can be added in such an amount that it does not adversely affect the compositions. The first underfill and the second underfill compositions can be prepared by mixing the aforesaid components with a mixing means, for example, a roller mill.

EXAMPLES

The present invention will be explained with reference to the following Examples, but the present invention is not limited thereto.

Example 1, Comparative Examples 1-3

Underfill compositions A-C were prepared by mixing the components as shown in Table 1 with a planetary mixer at room temperature and then passing the mixture obtained through a three-roller mill followed by remixing the mixture with the planetary mixer.

Details of the components shown in table 1 are as follows.

Epoxy resin: Cresol novolac type epoxy resin which has an epoxy equivalent weight of 200 and is solid at room temperature;

Curing agent: Phenol novolac resin which has a phenol equivalent weight of 110 and is solid at room temperature;

Filler: Spherical silica having an average particle size of 2.0 μm and a maximum particle size of 30 μm;

Silica fine powder: Aerosil 130 having an average particle size of 0.15 μm, ex Nippon Aerosil Co., Ltd.;

Diluent: Diethylene glycol monoethylether acetate;

Curing catalyst A: Tetraphenyl phosphine-tetraphenyl borate, ex Hokko Chemical Industry Co. Ltd.;

Curing catalyst B: 2-phenyl-4,5-dihydroxymethylimidazole (2PHZ), ex Shikoku Chemicals Co.;

Thermoplastic resin: Phenoxy resin having a weight average molecular weight of 10,000.

TABLE 1

| Underfill composition | A wt % | B wt % |
|---|---|---|
| Epoxy resin | 16.7 | 34.3 |
| Curing agent | 9.0 | 18.5 |
| Thermoplastic resin | 1.3 | 2.6 |
| Curing catalyst A | 0.6 | 1.2 |
| Filler  silica | 56.9 | 11.5 |
| Silica fine powder | 1.4 | 2.0 |
| Diluent | 14.1 | 29.9 |
| Filler/Solid (%) | 67.9 | 19.2 |

For evaluating the compositions, a semiconductor chip of a flip chip kit, JTEG Phase 2E175, lead-free grade having 576 solder bumps with a height of 70 μm, ex Hitachi ULSI Systems Co., Ltd., hereinafter referred to as "TEG", and a substrate, JKIT TYPE-III, ex Hitachi ULSI Systems Co., Ltd., were used. The semiconductor chip and the substrate are connected to make a daisy chain connection, that is, all the solder bumps had to be electrically connected for electrical continuity. A semiconductor device with at least one failure among 576 solder joints is rated as defective in an electrical continuity test.

Example 1

Composition A, as a first underfill composition, was applied on a TEG wafer by stencil printing. The wafer was placed in an oven at a temperature of 110° C. for 2 hours to bring the applied Composition A into a B-stage by evaporating the diluent. The layer of B-stage Composition A was 60 μm in thickness. On the B-stage Composition A, Composition B, as a second underfill composition, was applied by spin coating which was then put into a B-stage in the same manner as used for Composition A. An average total thickness of B-stage Compositions A and B was 90 μm.

Comparative Example 1

A layer having an average thickness of 90 μm was formed on a TEG wafer in the same manner as in Example 1 except that Composition A was used in place of Composition B as a second underfill composition.

Comparative Example 2

A layer having an average thickness of 90 μm was formed on a TEG wafer in the same manner as in Example 1 except that Composition B was used in place of Composition A as a first underfill composition.

Each wafer obtained was evaluated according to the following methods.

(1) Positioning

Ease of positioning a chip, obtained by dicing the wafer, with pads on the substrate was tested by using a flip chip bonder, model CB-50, ex Athlete FA Co.

(2) Solderability

A semiconductor device was prepared by the following method: By using the flip chip bonder, a chip was positioned on a substrate which was passed in an IR reflow furnace at a maximum temperature of 260° C. followed by heating in an oven at 150° C. for 4 hours to cure the underfill compositions. From each wafer, ten devices were prepared and subjected to a test for electrical continuity with a tester.

(3) Reliability

A device prepared in the above solderability test (2) was then subjected to a thermal cycling test of from −55° C. to 125° C. for 1,000 cycles and then tested again for electrical continuity with a tester.

The results are as shown in the following Table 2.

TABLE 2

|  | Example 1 | Comparative Example 1 | Comparative Example 2 |
| --- | --- | --- | --- |
| Positioning | Easy | Impossible | Easy |
| Solderability | 10/10 | — | 10/10 |
| Reliability | 10/10 | — | 3/10 |

In Comparative Example 1, a chip could not be positioned because the solder bumps were covered by the underfill composition comprising larger amount of filler to be invisible, so that a device for evaluating solderability and reliability could not be prepared. Devices of Comparative Example 2 showed cracks in the thermal cycling test, resulting in open circuit, due to smaller amount of filler. Devices of Example 1 showed good results in all the tests.

Examples 2 and 3, Comparative Examples 3 and 4

Underfill compositions D to G were prepared by mixing the components as shown in Table 3 with a planetary mixer at room temperature and then passing the mixture thus obtained through a three-roller mill followed by remixing the mixture with the planetary mixer.

TABLE 3

| Underfill composition | C wt % | D wt % | E wt % | F wt % | G wt % |
| --- | --- | --- | --- | --- | --- |
| Epoxy resin | 31.2 | 16.6 | 25.3 | 57.1 | 57.7 |
| Curing agent | 16.8 | 9 | — | — | — |
| Thermoplastic resin | 2.4 | 1.3 | 1.3 | 2.9 | 2.9 |
| Curing catalyst A | 1.1 | 0.6 | — | — | — |
| Curing catalyst B | — | — | 2.0 | 4.5 | 4.5 |
| Abietic acid | 1.1 | 0.6 | — | 1.1 | — |
| Filler    silica | 18.6 | 56.6 | 57.0 | 14.3 | 14.4 |
|             Silica fine powder | 2.7 | 1.4 | 1.4 | 3.1 | 3.1 |
| Diluent | 26.2 | 14 | 13.0 | 17.1 | 17.3 |
| Filler/Solid (%) | 28.8 | 67.5 | 67.2 | 20.9 | 21.2 |

Example 2

A layer having an average thickness of 90 μm was formed on a TEG wafer in the same manner as in Example 1 except that Composition C was used as a second underfill composition in place of Composition B.

Example 3

A layer having an average thickness of 90 μm was formed on a TEG wafer in the same manner as in Example 1 except that Composition E was used as a first underfill composition in place of Composition A and Composition F was used as a second underfill composition in place of Composition B.

Example 4

A layer having an average thickness of 90 μm was formed on a TEG wafer in the same manner as in Example 1 except that Composition F was used as a second underfill composition in place of Composition B.

Comparative Example 3

A layer having an average thickness of 90 μm was formed on a TEG wafer in the same manner as in Example 1 except that Composition G was used as a second underfill composition in place of Composition B.

Comparative Example 4

A layer having an average thickness of 90 μm was formed on a TEG wafer in the same manner as in Example 1 except that Composition D as a first underfill composition in place of Composition A and Composition C as a second underfill composition in place of Composition B were used.

Comparative Example 5

A layer having an average thickness of 90 μm was formed on a TEG wafer in the same manner as in Example 1 except that Composition D as a first underfill composition in place of Composition A and Composition G as a second underfill composition in place of Composition B were used.

Wafers obtained were diced with a dicer with a peripheral cutting blade. Chips obtained were positioned on a substrate and then evaluated according to the following methods.

(1) Solderability

A semiconductor device was prepared by the following method: By using the flip chip bonder, a chip was positioned on a substrate which was passed in an IR reflow furnace at a maximum temperature of 260° C. followed by heating in an oven at 150° C. for 4 hours to cure the underfill compositions. From each wafer, ten devices were prepared and subjected to a test for electrical continuity with a tester.

(2) Voids

The semiconductor devices prepared in the above solderability test (1) were observed for voids with a Scanning Acoustic Tomograph (SAT).

The results are as shown in Table 4. In the table, "Comp." stands for "Comparative", and "Yes" indicates that at least one void was detected.

TABLE 4

| | Example 2 | Example 3 | Example 4 | Comp. Example 3 | Comp. Example 4 | Comp. Example 5 |
|---|---|---|---|---|---|---|
| Solderability | 10/10 | 10/10 | 10/10 | 0/10 | 10/10 | 0/10 |
| Voids | None | None | None | None | Yes | Yes |

Poor solderability observed in Comparative Example 3 is due to lack of flux component in the second underfill composition. In Comparative Example 4, the first underfill composition contained a flux component which does not function as a curing agent. Good solderability was observed, but voids were detected in the connected portion. In Comparative Example 5, the first underfill composition contained a flux component, but the second underfill composition had lower flux capability, resulting in poor solderability and occurrence of voids.

The invention claimed is:

1. A method of manufacturing a semiconductor device comprising the steps of
   (1) applying an underfill composition to a surface of a silicon wafer on which surface solder bumps for flip chip bonding are provided and, then, bringing the underfill composition into a B-stage,
   (2) dicing the silicon wafer into chips,
   (3) positioning the chip with a site on a substrate where the chip is to be bonded, and
   (4) bonding the chip to the substrate by melting the solder bumps, characterized in that
   the underfill composition consists of a first underfill composition and a second underfill composition,
   the step (1) comprises the steps of
   (i) applying the first underfill composition on the surface of the silicon wafer and then bringing the applied first underfill composition into a B-stage to form a layer of the first underfill composition having a thickness ranging from 0.5 to 1.0 time the height of the solder bump, and
   (ii) applying the second underfill composition on the B-stage first underfill composition layer and bringing the applied second underfill composition into a B-stage to form a layer wherein a total thickness of the B-stage first underfill composition and the B-stage second underfill composition ranges from 1.0 to 1.3 times the height of the solder bump, and that
   the first underfill composition comprises an epoxy resin and a filler, the filler being in an amount of from 30 to 85 wt % of a solid content of the first underfill composition, and
   the second underfill composition comprises an epoxy resin, a flux and/or a curing agent functioning also as a flux.

2. The method according to claim 1, wherein the step (3) comprises the steps of heating the substrate and/or the chip at such a temperature that a surface of the first underfill composition and a surface of the second underfill composition become fluid, and pressure-bonding the chip to the substrate.

3. The method according to claim 1, wherein the second underfill composition comprises no filler or a filler of less than 30 wt % of a solid content of the second underfill composition.

4. The method according to claim 1, wherein the first underfill composition comprises no flux and no curing agent, or comprises a flux in an amount less than 0.5 part by weight per 100 parts by weight of resinous components of the first underfill composition or a curing agent functioning also as a flux in a molar ratio of the epoxy-reactive groups of the curing agent to the epoxy groups in the epoxy resin below 1.0.

5. The method according to claim 1, wherein the curing agent functioning also as a flux is selected from the group consisting of phenolic resins, acid anhydride curing agents and amine curing agents.

6. The method according to claim 1, wherein the application in the steps (i) and (ii) are performed by stencil printing or spin coating.

* * * * *